US006188900B1

United States Patent
Ruiz et al.

(10) Patent No.: US 6,188,900 B1
(45) Date of Patent: Feb. 13, 2001

(54) MOBILE DEVICE ASSISTED HANDOFF SYSTEM FOR CODE DIVISION MULTIPLE ACCESS AND WIDEBAND CODE DIVISION MULTIPLE ACCESS NETWORKS

(75) Inventors: Everardo D. Ruiz; Andrew M. Henwood, both of Richardson, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/143,712

(22) Filed: Aug. 31, 1998

(51) Int. Cl.$^7$ .................................................. H04Q 7/20
(52) U.S. Cl. ............................................. 455/436; 455/437
(58) Field of Search .................................... 455/422, 426, 455/436, 437, 438, 439, 447, 525, 432; 370/328, 330, 331, 332, 335, 337

(56) References Cited

U.S. PATENT DOCUMENTS

| 5,504,783 | * | 4/1996 | Tomisato et al. ................... 370/267 |
| 5,701,598 | * | 12/1997 | Atkinson ............................ 455/161.2 |
| 5,999,816 | * | 12/1999 | Tiedermann, Jr. et al. ......... 455/437 |
| 6,075,989 | * | 6/2000 | Moore et al. ....................... 455/437 |
| 6,078,570 | * | 6/2000 | Czaja et al. ........................ 455/437 |

* cited by examiner

Primary Examiner—William G. Trost
Assistant Examiner—Jean A Gelin
(74) Attorney, Agent, or Firm—Ronald O. Neerings; Wade James Brady, III; Frederick J. Telecky, Jr.

(57) ABSTRACT

A system and method for providing hard handoff in a mobile communication system wherein there are provided a plurality of spaced apart base stations, each base station equipped for communication with mobile stations at a different frequency from the other of the base stations and a mobile device for intermittent communication with one of the base stations. The mobile device includes a first normally operating circuit, preferably a PLL, for providing an operating frequency at the mobile device having a relatively slow tuning period for communication with the one of the base stations and second normally non-operating circuitry, preferably a DDS, for providing a frequency different from the frequency for communication with the one of the base stations having a rapid tuning period relative to the first circuitry. The second circuitry is activated during periods of non-communication of the mobile device with the one of the base stations to test for candidate base stations for handoff at a the frequency different from the frequency for communication with the one of the base stations and communication is switched to the candidate base station using said second circuitry for providing the different frequency responsive to an indication of one of improved signal strength or signal integrity from the candidate base station. Responsive to the switch to communication with the candidate base station, the frequency of the first circuitry is changed to the different frequency. Also, responsive to the first circuitry settling at the different frequency, the different frequency from the first circuitry is provided and the second circuitry is disabled.

16 Claims, 3 Drawing Sheets

MOBILE DEVICE ASSISTED HANDOFF SYSTEM FOR CODE DIVISION MULTIPLE ACCESS AND WIDEBAND CODE DIVISION MULTIPLE ACCESS NETWORKS

CROSS REFERENCE TO RELATED APPLICATIONS

This application is related to Ser. No. 09/143,988, Filed Aug. 31, 1998, the contents of which are incorporated herein by reference.

FIELD OF THE INVENTION

This invention relates to a method and circuitry for a mobile device assisted handoff system for code division multiple access and wideband code division multiple access networks.

BRIEF DESCRIPTION OF THE PRIOR ART

Code division multiple access (CDMA) networks are full duplex systems which are capable of simultaneous transmission and reception. CDMA mobile systems transmit to and receive from different base stations as they move about, the particular base station utilized at any point in time generally being related to signal strength and/or signal integrity from the base station, this generally being related to geography (i.e., the closest base station to the mobile unit at a given point in time). In CDMA, the delta f or frequency difference between the transmit frequency and the receive frequency is always the same constant for a given mobile device. As the mobile unit moves away from one base station and toward other base stations, the mobile unit will ultimately change base stations with which it is in contact, the change again generally being related to signal strength and/or signal integrity of the base station signal. This base station change requires a change in frequency of transmission and/or reception and is referred to in the art as "hard handoff". CDMA radio networks of the prior art have placed the burden of coordinating hard handoff (switching radio frequencies as the mobile device moves from base station to base station or from cell to cell) on the base station alone. At hard handoff, the frequency synthesizer in the mobile device tunes to the new frequency and the data transmission/ telephone call resumes only after the synthesizer in the mobile device settles at the new frequency. This frequency tuning and locking processing, based upon present synthesizer topologies, requires on the order of 5 milliseconds in CDMA mobile devices. The result of failure to provide proper handoff is often a dropped call with the apparent consequences thereof, both when voice information as well as data are being transmitted.

In an attempt to alleviate this problem, new CDMA and wideband CDMA (W-CDMA) networks are being standardized to require that the mobile device participate actively along with the base station in the hard handoff process to simultaneously reduce the settling time of the synthesizer in the mobile device providing the operating frequency by up to an order of magnitude. This requires that the mobile unit continue to operate at the serving frequency while constantly being on the lookout by sampling for superior candidate channels which operate at a different frequency so that handoff can take place, when required, to the best available base station. The problem arises that the presently used integer-N synthesizer topology is incapable of simultaneously providing the required very fast frequency settling time while meeting increasingly stringent phase noise requirements. This problem increases in the case of W-CDMA networks which operate at even higher data rates since even the faster state of the art fractional-N synthesizer topology is inadequate for the same reasons as in CDMA.

SUMMARY OF THE INVENTION

In accordance with the present invention, the above described problems inherent in the prior art is minimized.

Briefly, several frequency synthesis techniques are utilized to achieve a "best of both worlds" synthesizer lock time, phase noise, and power consumption performance. The synthesizer topology in accordance with the present invention (see FIG. 2) takes advantage of the classic integer-N synthesizer in combination with a direct digital synthesizer (DDS) which is clocked from the output frequency of another of the synthesizers in the CDMA mobile device. Programming of the DDS output frequency and integer-N synthesizer is achieved using information provided by the CDMA base station as part of the mobile assisted handoff (MAHO). As part of MAHO, the DDS is powered up and tuned to the candidate frequency instead of the output from the integer-N synthesizer. Then, a two input selector toggles to select the mixed output from the DDS at the target frequency. The sub 100 microsecond tuning time of the DDS allows the CDMA receiver to begin its time-consuming pilot search as well as data and clock resynchronization almost immediately. Signal strength measurements are made at the "candidate frequency" provided by the DDS. If MAHO occurs, the DDS maintains its frequency while the synthesizer is programmed and begins to tune to the candidate frequency. As the integer-N synthesizer begins to settle at the target frequency a short time later (several milliseconds), the out of lock indicator is disabled, toggling the two input selector and selecting the low phase noise output from the integer-N oscillator again, while powering down the DDS.

A benefit derived from the invention are significantly reduced probability of "call dropping" at CDMA hard handoff "in network" and especially during hard handoff between cells operated by different network providers (due to inadequate time for hard hand off tuning and call processing). In addition, high speed tuning is achieved without consuming large amounts of power (the DDS is powered up only briefly prior to hard handoff). Also, the DDS technology can be integrated directly into semiconductor integrated circuits. Existing CDMA mobile radio architectures can easily adapt to the above described technology by adding minimal components to the mobile device. This approach is directly scalable to W-CDMA networks (e.g., future CDMA networks, such as 3rd generation GSM).

DESCRIPTION OF THE PREFERRED EMBODIMENT

Figure 1:
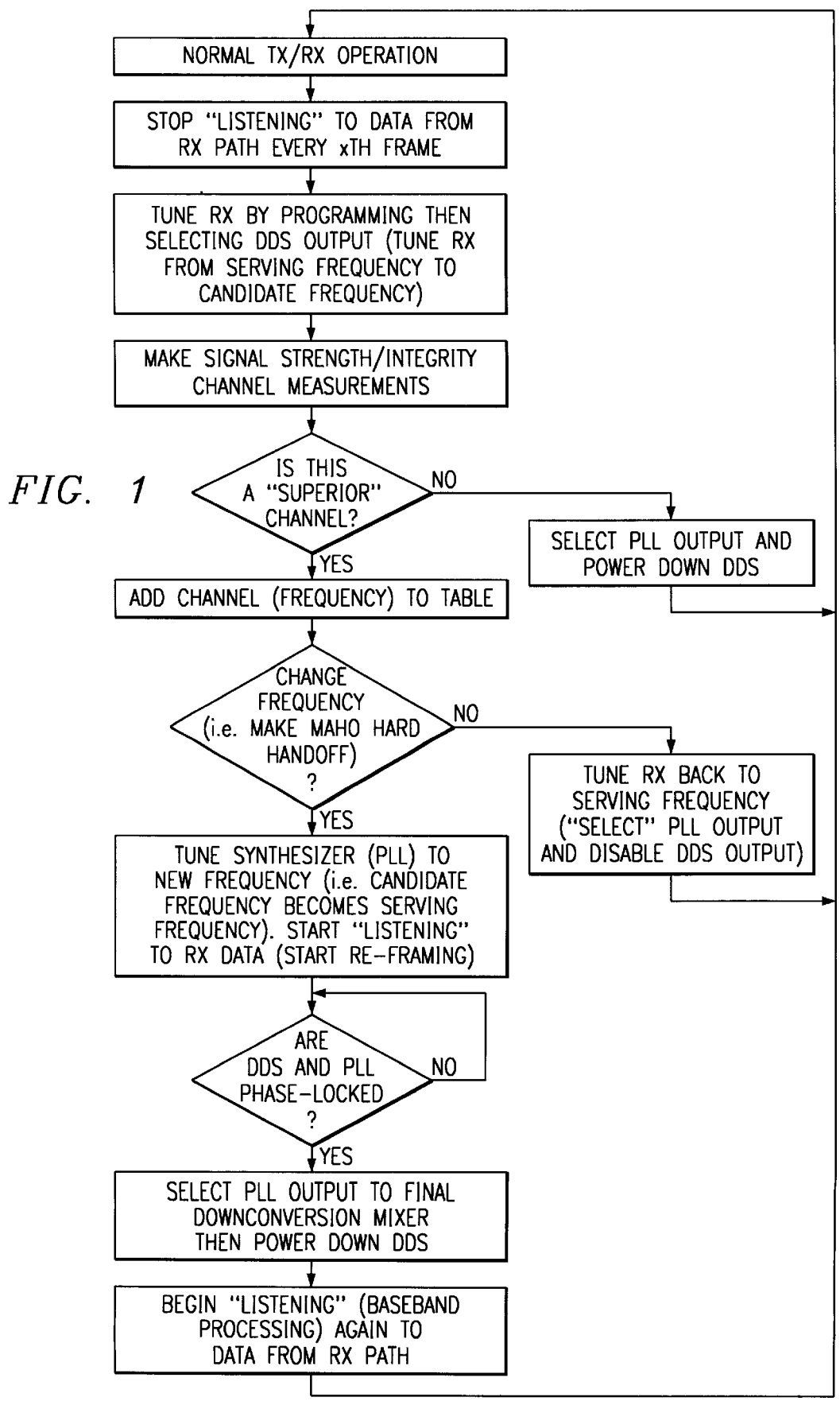
FIG. 1 is a flow chart of the operation of a mobile system in accordance with the present invention.

Referring to FIG. 1, there is shown a flow chart of the operation of a mobile system in accordance with the present invention 2 during mobile assisted handoff (see FIG. 3) in a CDMA system with full duplex operation. The procedure of FIG. 1 is repeated every $x^{th}$ frame corresponding to about 10 to 20 milliseconds, for example. A frame is a window having a known time duration during which data is received and/or transmitted. The system is measuring signal strength and/or signal integrity to be ready for handoff to another channel when appropriate. Accordingly, in normal operation of transmit/receive as shown in box (1) during every $x^{th}$ frame when there is no meaningful communication between the mobile device and the base station providing the serving frequency to which the mobile device is presently tuned, the mobile device stops listening to data entering the mobile unit through its receive path as shown in box (2) and tunes the receiver in the mobile device from the serving frequency to a candidate frequency using a direct digital synthesizer (DDS) which is capable of switching to the candidate frequency much more rapidly than can the phase locked loop (PLL) which is the standard mobile device synthesizer as shown in box (3). The received signals at the candidate frequency are then measured as to strength, integrity and whatever other measurements may be appropriate under the circumstances as shown in box (4). If the candidate frequency is inferior to the serving frequency or rejected for some other reason, the system returns to the serving frequency for operation at that frequency during the following frame under control of the PLL when the mobile device will again be in a mode to receive from the serving base station as shown in boxes (5) and (6). On the other hand, if the candidate frequency is superior to the serving frequency, that frequency is stored in a table for present or later use as shown in box (8) and a determination is made whether to make a change in frequency at that time by providing a mobile assisted handoff as shown in box (9). If no handoff is to take place, the system is returned to the serving frequency under control of the PLL as shown in box 7 and normal operation resumes since the PLL is still operating at the serving frequency. If a handoff is to take place as shown in box (9), the synthesizer or PLL commences change to the new frequency and operation at the new frequency is commenced after the very short tuning period required by the direct digital synthesizer (DDS) and using the DDS in place of the PLL as shown in box (10). The frequency and phase of the DDS and the PLL are compared as shown in box (11) and, if the two are not phase and frequency locked, operation continues using the DDS. When the two are phase and frequency locked, the PLL takes over for the DDS and the DDS is powered down as shown in box (12). Reception at the new frequency is commenced with the onset of operation of the DDS after the short tuning period with continued reception continuing uninterrupted when the PLL takes over for the DDS as shown in box (13). The reason for the use of the DDS as noted in the above mentioned copending application is that the PLL requires a much greater tuning time than does the DDS, the DDS being used when the greater tuning time required by the PLL cannot be tolerated.

Figure 2:
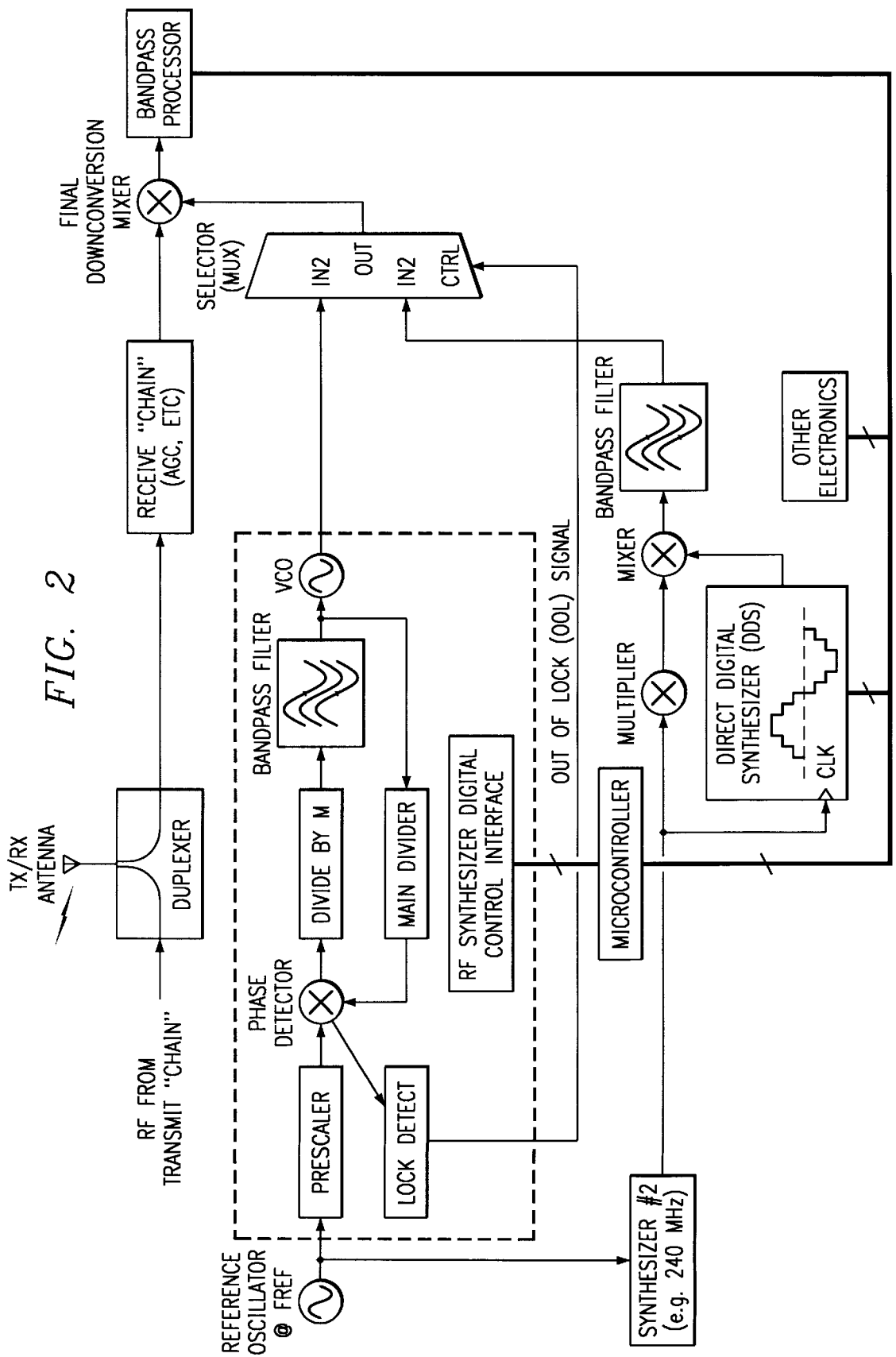
FIG. 2 is a block diagram of a mobile device in accordance with the present invention.

Referring to FIG. 2, there is shown a block diagram of a mobile device in accordance with a preferred embodiment of the present invention. The circuit includes a PLL of standard design under control of a reference frequency oscillator ($f_{ref}$) and a voltage controlled oscillator (VCO) controlled by the PLL. There is also provided a DDS, the output of which is applied to a mixer along with the output of a separate synthesizer to provide an output frequency from the mixer higher than is available from the DDS, this output frequency being filtered in a low pass filter (LPF) to provide a single tone at the candidate frequency. The output of one of the LPF and the VCO is selected by a controlled selector switch so that the normally constant difference in frequency between the transmitter and receiver can be varied to allow signal measurements or candidate frequencies. FIG. 2 presents a block diagram of the radio frequency (RF)-to-baseband downconversion process. As shown, a microcontroller or microprocessor programs the direct digital synthesizer (DDS) and other synthesizers, controls and evaluates results of baseband processing, toggles a switch used in determining which of the sources (i.e., DDS vs. conventional synthesizer) is used in the IF-to-baseband downconversion, and also controls other electronics (user display, audio volume, etc.).

As shown in FIG. 2, the RF output from the synthesizer (composed of the reference oscillator ($f_{ref}$), divide by M circuit, divide by N circuit, phase detector, low pass filter and voltage controlled oscillator (VCO) is selected by a switch to be used for downconversion of a signal at an intermediate frequency (IF) to baseband.

However, during a mobile assisted handoff, the switch instead selects a signal which is generated from the mixing of the direct digital synthesizer (DDS) output frequency and a higher order harmonic of an additional synthesizer.

Figure 3:
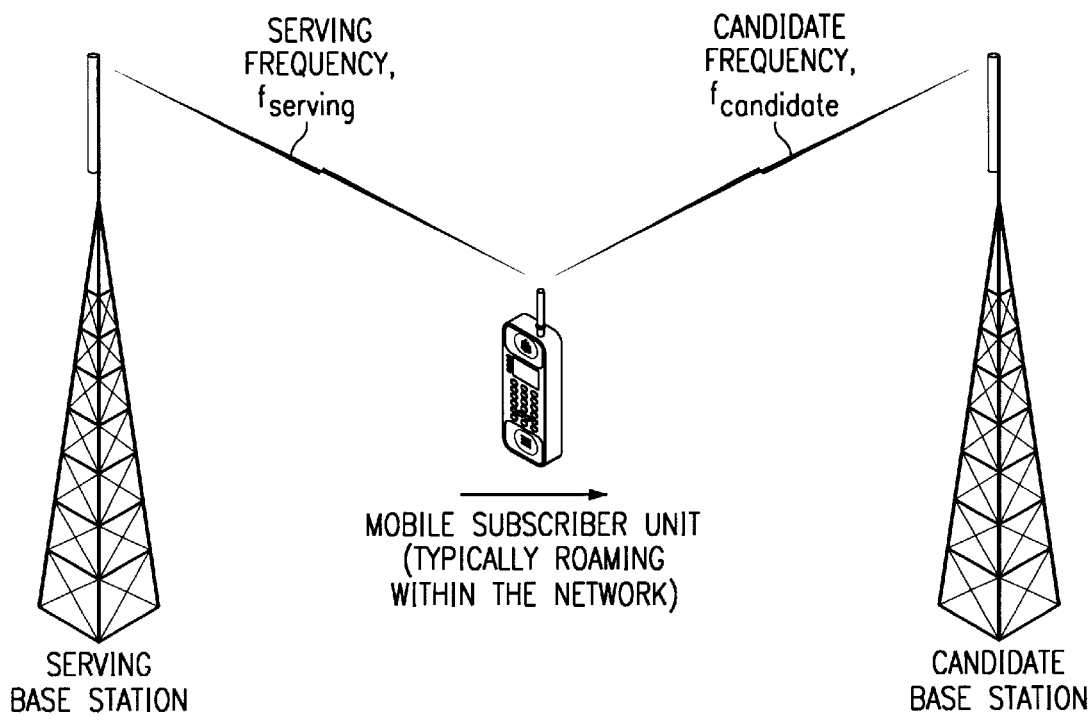
FIG. 3 is a graphic illustration of the candidate and serving frequencies concept in accordance with the present invention.

Referring to FIG. 3, there is shown a graphic illustration of the candidate and serving frequency concept with which the subject invention is involved. The mobile device is typically moving within a network of base stations, the mobile station communication with one of the base stations and periodically moving away from that base station and toward one or more other base stations. The base stations in the network send out a list of candidate frequencies and the mobile device tunes to a candidate frequency ($f_{candidate}$) and makes a signal strength measurement. The mobile device then tunes back to the serving frequency ($f_{serving}$) If the serving base station provides the appropriate response, the mobile device may switch to the new frequency whereby $f_{candidate}$ now becomes the serving frequency and communication is with that base station.

Referring to FIG. 3, there is shown a graphic illustration of the candidate and serving frequency concept in accordance with the present invention. The serving base station sends a list of candidate frequencies to the mobile station. The mobile station tunes to the candidate frequency (e.g., $f_{candidate}$) and makes a signal strength measurement at that frequency. The mobile station then tunes back to the serving base station frequency (e.g., $F_{serving}$). If the serving base station provides the appropriate signal, the mobile station can switch to the new frequency and $F_{candidate}$.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A system for providing hard handoff in a mobile communication system which comprises:
   (a) a plurality of spaced apart base stations, each base station equipped for communication with mobile stations at a frequency different from the other of said base stations; and
   (b) a mobile device for intermittent communication with one of said base stations, said mobile device including:
      (i) first normally operating circuitry at said mobile device for communication with one of said base stations at a first operating frequency, said first normally operating circuitry having a relatively slow tuning period for communication with said one of said base stations;

(ii) second normally non-operating circuitry at said mobile device for communication with a different one of said base stations at an operating frequency different from said first operating frequency, said second normally non-operating circuitry having a rapid tuning period relative to said first normally operating circuitry;

(iii) circuitry for activating said second normally non-operating circuitry during periods of non-communication of said mobile device with said one of said base stations to test for candidate base stations for handoff at a frequency different from said first operating frequency, (iv) switch circuitry responsive to at least one of an indication of improved signal strength or signal integrity at said frequency different from said first operating frequency to switch to communication with said candidate base station using said second normally non-operating circuitry; and (V) circuitry responsive to said first normally operating circuitry operating at said frequency different from said first operating frequency for placing said second normally non-operating circuitry in said normally non-operating condition and placing said normally operating circuitry in the operating condition.

2. The system of claim 1 further including means responsive to said switch circuitry to communication with said candidate base station to alter the frequency of said first circuitry to said different frequency.

3. The system of claim 1 wherein said first circuitry is a PLL and said second circuitry is a DDS.

4. The system of claim 2 wherein said first circuitry is a PLL and said second circuitry is a DDS.

5. A method for providing hard handoff in a mobile communication system which comprises the steps of:

(a) providing a plurality of spaced apart base stations, each base station equipped for communication with mobile stations at a frequency different from the other of said base stations;

(b) providing a mobile device for intermittent communication with one of said base stations, said mobile device including:

(i) first normally operating circuitry at said mobile device for communication with one of said base stations at a first operating frequency having a relatively slow tuning period for communication with said one of said base stations; and (ii) second normally non-operating circuitry at said mobile device for communication with a different one of said base stations at an operating frequency different from said first operating frequency, said second normally non-operating circuitry having a rapid tuning period relative to said first normally operating circuitry;

(c) activating said second normally non-operating circuitry during periods of non-communication of said mobile device with said one of said base stations to test for candidate base stations for handoff at a frequency different from said first operating frequency, (d) switching to communication with said candidate base station using said second normally non-operating circuitry responsive to at least one of an indication of improved signal strength or signal integrity at said frequency different from said first operating frequency; and (e) responsive to said first normally operating circuitry operating at said frequency different from said first operating frequency, placing said second normally non-operating circuitry in said normally non-operating condition and placing said normally operating circuitry in the operating condition.

6. The method of claim 5 further including, responsive to said switching to communication with said candidate base station, altering the frequency of said first circuitry to said different frequency.

7. The method of claim 5 wherein said first circuitry is a PLL and said second circuitry is a DDS.

8. The method of claim 6 wherein said first circuitry is a PLL and said second circuitry is a DDS.

9. A mobile device for intermittent communication with one of a plurality of base stations, each base station equipped for communication with mobile stations at a different frequency from the other of said base stations, said mobile device including:

(a) first normally operating circuitry at said mobile device for communication with one of said base stations at a first operating frequency, said first normally operating circuitry having a relatively slow tuning period for communication with said one of said base stations;

(b) second normally non-operating circuitry at said mobile device for communication with a different one of said base stations at an operating frequency different from said first operating frequency, said second normally non-operating circuitry having a rapid tuning period relative to said first normally operating circuitry;

(c) circuitry for activating said second normally non-operating circuitry during periods of non-communication of said mobile device with said one of said base stations to test for candidate base stations for handoff at a frequency different from said first operating frequency, (d) switch circuitry responsive to at least one of an indication of improved signal strength or signal integrity at said frequency different from said first operating frequency to switch to communication with said candidate base station using said second normally non-operating circuitry; and (e) circuitry responsive to said first normally operating circuitry operating at said frequency different from said first operating frequency for placing said second normally non-operating circuitry in said normally non-operating condition and placing said normally operating circuitry in the operating condition.

10. The system of claim 9 further including means responsive to said switch circuitry to communication with said candidate base station to alter the frequency of said first circuitry to said different frequency.

11. The system of claim 9 wherein said first circuitry is a PLL and said second circuitry is a DDS.

12. The system of claim 10 wherein said first circuitry is a PLL and said second circuitry is a DDS.

13. A method for providing hard handoff in a mobile communication device which comprises the steps of:

(a) providing first normally operating circuitry for communication with a first base station at a first operating frequency having a relatively slow tuning period for communication with said first base station;

(b) providing second normally non-operating circuitry for communication with a different base station at an operating frequency different from said first operating frequency, said second normally non-operating circuitry having a rapid tuning period relative to said first normally operating circuitry;

(c) activating said second normally non-operating circuitry during periods of non-communication of said mobile device with said first base station to test for candidate base stations for handoff at a frequency different from said first operating frequency, (d) switching to communication with said candidate base station using said second normally non-operating circuitry responsive to at least one of an indication of improved signal strength or signal integrity at said frequency different from said first operating frequency; and (e) responsive to said first normally operating circuitry operating at said frequency different from said first operating frequency, placing said second normally non-operating circuitry in said normally non-operating condition and placing said normally operating circuitry in the operating condition.

14. The method of claim 13 further including, responsive to said switching to communication with said candidate base station, altering the frequency of said first circuitry to said different frequency.

15. The method of claim 13 wherein said first circuitry is a PLL and said second circuitry is a DDS.

16. The method of claim 14 wherein said first circuitry is a PLL and said second circuitry is a DDS.

* * * * *